Nov. 13, 1962 G. P. McGRAW, JR 3,063,134

METHOD OF MOUNTING ELECTRICAL COMPONENTS

Filed Dec. 11, 1958

INVENTOR
G. P. Mc. GRAW JR.
BY R. P. Miller
ATTORNEY

United States Patent Office 3,063,134

Patented Nov. 13, 1962

3,063,134

METHOD OF MOUNTING ELECTRICAL COMPONENTS

George P. McGraw, Jr., Downers Grove, Ill., assignor to Western Electric Company, Incorporated, New York, N.Y., a corporation of New York Filed Dec. 11, 1958, Ser. No. 779,711
2 Claims. (Cl. 29—155.5)

This invention relates to a mount for electrical components and a method for making the mount or more particularly, to a mount and method of making a mount wherein an encapsulated electrical component is supported in spaced relationship to a mounting board.

In the past, electrical components, as capacitors, coils or the like, have been attached by leads or terminals to a mounting board of electrically insulating material having mounting screws or bolts thereon and then the assembly has been immersed in an encapsulating resin until only the upper surface of the board is exposed. This process results in an article having a solid block of the encapsulating resin surrounding the electrical component and the sides and bottom surface of the board with a pair of mounting bolts and a component lead extending from the board.

Many disadvantages are incurred in both the above described process and in the resultant component mount produced thereby. For example, it is necessary in the process to immerse the component and board in the coating material to precisely the depth where the sides of the board will be completely coated and the upper surface will be free of the coating material. If the coating material is allowed to reach the upper surface of the mounting board, an irregular surface is obtained and the component cannot be mounted perpendicularly to a chasis or other flat support. Further, the adherence of coating compound to the upper surface of board results in an unsightly product. To perform this dipping operation, very accurate and expensive machinery is required and the operation must be performed slowly and with great care. Also, as the mounting boards are often of a fiber material, it is extremely difficult to obtain a complete or strong adherence between the fiber board and a plastic encapsulating compound. This tendency of a weak and incomplete adherence between the encapsulated body and fiber board and the difficulty of immersing the assembly to an exact level, not only results in a poor appearance of the component mount but also in a structurally weak mount because the leads of the component receive very little support from the encapsulating body. The purpose of such a mount is not only to protect the electrical component but also to prevent stresses and strains from being placed on the component leads. The prior methods of making such a mount are not sufficient to give the required protection to the leads.

It is therefore an object of this invention to provide a new and improved mount for electrical components.

Another object of this invention is to provide a mount for electrical components which will provide a rigid support for the component while presenting a pleasing appearance.

Another object of the invention is to provide a mount for electrical components having reinforcing members extending between an encapsulating body surrounding the component and a mounting board for relieving stresses on the component leads.

Another object of the invention is to provide a new and improved method for making mounts for electrical components.

A further object of the invention is to provide a method for making a mount for electrical components by supporting a component in spaced relationship to a mounting board and forming an encapsulating body around the component.

With these and other objects in view, the present invention contemplates a mount for electrical components and a method for making the mount. The mount comprises a mounting board of electrically insulating material having bolts extending therethrough with the threaded portions of the bolts extending above the board. The bolts are provided with short studs or shafts which extend from the heads of the bolts below the board toward an electrical component which is connected to the board by leads extending from the component through the board. The leads are crimped on either side of the board. An insulating body surrounds the electrical component and a portion of the studs so that the component is maintained in spaced relationship to the mounting board. The mount is made by securing the bolts to the mounting board with the studs of the bolts projecting below the lower surface of the board. Component leads are then inserted through suitable apertures in the board and crimped on either side thereof to suspend the component from the board below the bottoms of the studs. The assembly is then immersed or dipped into an insulating coating material to encapsulate the component and a portion of the studs to form a rigid body spaced from and secured to the mounting board.

Other objects, advantages and novel aspects of the invention will become apparent upon consideration of the following detailed description of a specific embodiment thereof, in conjunction with the accompanying drawings wherein.

Figure 3:
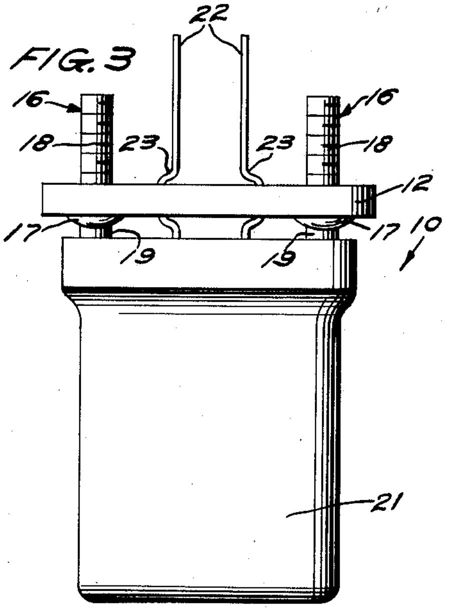
FIG. 3 is a front view of a completed mount embodying the principles of the present invention.
Figure 4:
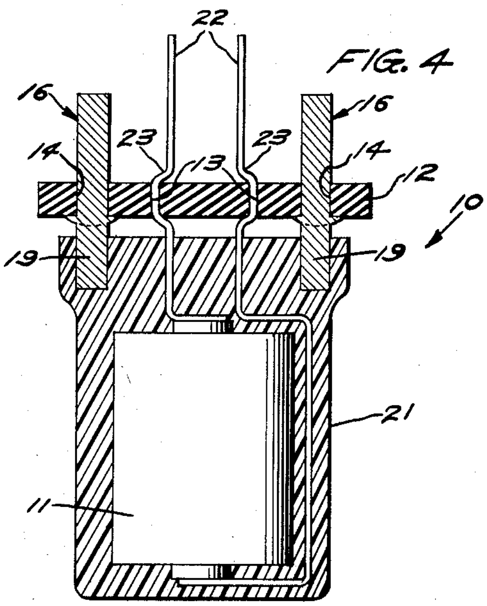
FIG. 4 is a sectional view of the completed mount shown in FIG. 3.

Attention is directed to FIGS. 3 and 4 of the drawings wherein there is shown a mount 10 for electrical components, for example, a capacitor 11. The mount 10 consists of a mounting board 12 of an electrically insulating material, such as a fiber board, having two pairs of preformed apertures 13 and 14. A pair of bolts 16 are secured in the apertures 14 such that heads 17 engage the lower surface of the board 12 and threaded shafts 18 extend through the apertures 14. The heads 17 of the bolts 16 are formed with short studs 19 projecting from the heads below the mounting board 12 into a solid block or body 21 of an encapsulating resin, such as an epoxy resin. The block 21 surrounds the capacitor 11 and the greater part of the studs 19. A pair of lead wires 22 extend from the capacitor and the body 21 and project through the apertures 13 in the board 12. The leads 22 are provided with bent or crimped portions 23 on either side of the board 12 to secure the leads thereto and to prevent relative movement between the leads and the board.

It may be understood that, as the studs 19 of the bolts 16 form a rigid connection between the encapsulating body 21 and the mounting board 12, the studs will absorb the stresses and strains applied to the mount from mechanical vibrations and other external forces and thus will relieve the component leads from such stresses. Also, as the body 21 is spaced from the fiber mounting board 12, problems of obtaining a strong adherence between the body and the board are eliminated.

Figure 1:
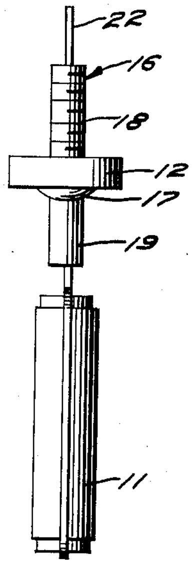
FIGS. 1 and 2 are side and front elevation views of an electrical component and a mounting board before a coating or dipping operation.
Figure 2:
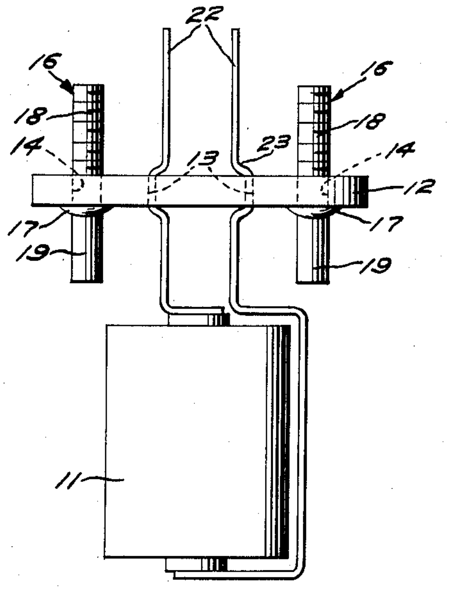

A method of producing a mount of the type shown in FIGS. 3 and 4 includes the steps of punching the boards 12 from a fiber material with preformed apertures 13 and 14 then inserting the bolts 16 through the apertures 14. The bolts are staked or otherwise secured to the board 12 from beneath so that the threaded shafts 18 project upward from the board and the short studs 19 project downward therefrom. Leads 22 of an electrical component 11 are then inserted through apertures 13 in the board 12 and crimped on either side of the board to suspend the component 11 from the board 12 below the bottoms of the studs 19 solely by the lead wires 22, as shown in FIGS. 1 and 2. The assembled board 12, capacitor 11 and bolts 16 are next dipped or immersed into a bath of a fluid encapsulating resin, for example, an epoxy resin compound, to a level where the capacitor 11 and portions of the studs 19 and lead wires 22 are submerged, but where the board 12 is above the upper surface of the bath. The resin is then cured to form an encapsulating body 21 around the component 11 and the immersed portions of the studs 19, as previously described and as illustrated in FIG. 4.

This method of manufacturing mounts for electrical components posses many advantages over the methods used in the prior art, in that, it is not necessary to immerse the components into a coating material to a precise or critical level, as in necessary when the fiber board 12, as well as the component 11, is to be surrounded by the coating material. Also, with the present method, great care need not be taken in the immersing or dipping operation in an attempt to obtain the complete and strong adherence between the fiber board 12 and the dipping material as was required by prior methods.

It is to be understood that the above-described arrangements are simply illustrative of the application of the principles of this invention. Numerous other arrangements may be readily devised by those skilled in the art which will embody the principles of the invention and fall within the spirit and scope thereof.

What is claimed is:

1. The method of mounting a capacitor having a pair of spaced parallel lead wires projecting upward therefrom, which comprises the steps of providing a fiber mounting board having a pair of small apertures near the center thereof which are spaced somewhat further apart than the distance between the lead wires and having a pair of larger apertures near the outer edges thereof; staking a pair of bolts in the larger apertures from beneath the board so that heads of the bolts engage the lower surface of the board, so that threaded shafts of the bolts project upward from the board to enable eventual mechanical connection of the capacitor to a chasis, and so that short studs of the bolts project downward from the board near the outer edges thereof; inserting the capacitor lead wires through the small apertures of the board from beneath the board so that the ends of the lead wires project upward from the board to enable eventual electrical connection of the capacitor; crimping intermediate portions of the lead wires on either side of the board so that the capacitor is positioned below the bottoms of the bolt studs and is suspended from the board solely by the lead wires; dipping the assembly of the board and capacitor into a bath of a fluid epoxy resin to a level where the entire capacitor and portions of the studs and lead wires are submerged, but where the board is above the upper surface of the bath; and then curing the epoxy resin to a solid block thereof which encapsulates the capacitor, is spaced beneath the board, and is rigidly connected thereto by the studs so that the studs absorb external forces applied to the assembly.

2. The method of making a partially encapsulated electrical assembly including a mounting board of an electrically insulating material having a pair of apertures near the center and a pair of apertures near the outer edges and an electrical component having a pair of lead wires projecting therefrom, which comprises the steps of inserting a pair of studs through the outer apertures and securing the studs to the board so that portions of the studs project downward from the board; inserting the component lead wires through the inner apertures and securing the lead wires to the board so that the ends thereof project upward from the board and so that the component is suspended from the board below the bottoms of the studs solely by the lead wires; dipping the suspended component into a bath of a fluid encapsulating resin to a level where the component and portions of the studs and lead wires are submerged, but where the board is above the upper surface of the bath; and then curing the resin to form a solid block thereof which encapsulates the component, is spaced from the board, and is rigidly connected to the board by the studs so that the studs absorb external forces applied to the assembly.

References Cited in the file of this patent

UNITED STATES PATENTS

| | | |
|---|---|---|
| 1,996,123 | Rodgers | Apr. 2, 1935 |
| 2,181,695 | Given | Nov. 28, 1939 |
| 2,337,678 | Nowell et al. | Dec. 23, 1943 |
| 2,731,607 | Gould | Jan. 17, 1956 |
| 2,774,051 | McCarthy | Dec. 11, 1956 |
| 2,779,813 | Collins | Jan. 29, 1957 |
| 2,829,426 | Franklin | Apr. 8, 1958 |
| 2,862,992 | Franz | Dec. 2, 1958 |
| 2,871,549 | Arnold | Feb. 3, 1959 |